(12) United States Patent
Kim et al.

(10) Patent No.: US 10,637,000 B2
(45) Date of Patent: Apr. 28, 2020

(54) APPARATUS, METHOD OF MANUFACTURING DISPLAY APPARATUS, AND PROTECTIVE FILM

(71) Applicant: LG Display Co., Ltd., Seoul (KR)

(72) Inventors: JungHan Kim, Bucheon-si (KR); Wonjin Choi, Bucheon-si (KR); GeeSung Chae, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 2 days.

(21) Appl. No.: 15/976,256

(22) Filed: May 10, 2018

(65) Prior Publication Data
US 2019/0006620 A1    Jan. 3, 2019

(30) Foreign Application Priority Data
Jun. 28, 2017   (KR) .................. 10-2017-0082056

(51) Int. Cl.
| | |
|---|---|
| *H01L 29/08* | (2006.01) |
| *H01L 51/52* | (2006.01) |
| *G02B 5/30* | (2006.01) |
| *H01L 27/32* | (2006.01) |
| *G02B 1/14* | (2015.01) |
| *B32B 7/06* | (2019.01) |
| *G02F 1/1333* | (2006.01) |

(52) U.S. Cl.
CPC ............ *H01L 51/5253* (2013.01); *B32B 7/06* (2013.01); *G02B 1/14* (2015.01); *G02B 5/30* (2013.01); *H01L 27/3262* (2013.01); *H01L 51/5206* (2013.01); *H01L 51/5221* (2013.01); *H01L 51/5237* (2013.01); *H01L 51/5246* (2013.01); *G02F 2001/133311* (2013.01); *G02F 2201/50* (2013.01); *G02F 2202/28* (2013.01); *H01L 27/323* (2013.01); *H01L 51/5281* (2013.01)

(58) Field of Classification Search
CPC ............ H01L 27/3248; H01L 27/3262; H01L 51/003; H01L 51/0035; H01L 51/0097; H01L 51/56; H01L 51/5206; H01L 51/5221; H01L 51/5246; H01L 51/5253; H01L 51/5256
USPC .......................................................... 257/40
See application file for complete search history.

(56) References Cited

U.S. PATENT DOCUMENTS

2009/0251643 A1* 10/2009 Yamada ................ C08J 5/18
349/96
2018/0069196 A1* 3/2018 Lee ..................... H01L 51/0097

* cited by examiner

*Primary Examiner* — Brook Kebede
(74) *Attorney, Agent, or Firm* — Morgan, Lewis & Bockius LLP

(57) ABSTRACT

An apparatus includes a substrate; a display panel on the substrate; and a protective film protecting one of the substrate and the display panel, wherein the protective film includes a first protective film and a second protective film, wherein the first protective film is disposed closer to the display panel than the second protective film, and wherein the first protective film includes a polymerizable compound having an adhesive strength that changes with energy irradiated onto the polymerizable compound.

18 Claims, 9 Drawing Sheets

ENERGY IRRADIATION

APPARATUS, METHOD OF MANUFACTURING DISPLAY APPARATUS, AND PROTECTIVE FILM

This application claims the benefit of the Korean Patent Application No. 10-2017-0082056, filed on Jun. 28, 2017, which is hereby incorporated by reference as if fully set forth herein.

BACKGROUND

Technical Field

The present disclosure relates to a display apparatus and a method of manufacturing the display apparatus, and more particularly, to a display apparatus including a protective film.

Discussion of the Related Art

Recently, as society advances to the information-oriented society, the field of display devices for visually expressing an electrical information signal has rapidly advanced. Various display devices, having excellent characteristics in terms of thin profile, light weight, and low power consumption, are being developed.

Examples of the display devices include liquid crystal display (LCD) devices, field emission display (FED) devices, organic light emitting display (OLED) devices, etc. The organic light emitting display devices, which are self-emitting devices, have a fast response time, high emission efficiency, excellent luminance, and a wide viewing angle in comparison with other display devices, and thus, are being widely developed.

Moreover, when an organic light emitting display device or an LCD device is applied to electronic devices, such as portable phones, a touch panel may be applied to an organic light emitting display panel or a liquid crystal panel. When the touch panel is attached to the organic light emitting display panel or the liquid crystal panel using an adhesive, a protective film for protecting the organic light emitting display panel or the liquid crystal panel is removed, and then, the touch panel is attached on the organic light emitting display panel or the liquid crystal panel. However, the protective film for protecting the organic light emitting display panel or the liquid crystal panel is not easily separated from the organic light emitting display panel or the liquid crystal panel. For this reason, the organic light emitting display panel or the liquid crystal panel may be damaged.

SUMMARY

Therefore, the inventors have recognized the above-described problems and have conducted various experiments for decreasing an adhesiveness or an adhesive strength of a protective film which should be separated from an organic light emitting display panel or a liquid crystal panel under a condition of reducing an influence of the organic light emitting display panel or the liquid crystal panel, in a process of removing a protective film which protects the organic light emitting display panel or the liquid crystal panel.

Through the various experiments, the inventors have invented a protective film having an adhesiveness or an adhesive strength that can be reduced.

Accordingly, embodiments of the present disclosure are directed to a display apparatus and a method of manufacturing the display apparatus including a protective film that substantially obviate one or more problems due to limitations and disadvantages of the related art.

An aspect of the present disclosure is to provide a display apparatus and a method of manufacturing the display apparatus, in which an adhesiveness or an adhesive strength of a protective film can vary or change.

The objects of the present disclosure are not limited to the aforesaid, but other objects not described herein will be clearly understood by those skilled in the art from descriptions below.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages and in accordance with the purpose of the disclosure, as embodied and broadly described herein, a display apparatus comprises a substrate; a display panel on the substrate; and a protective film protecting one of the substrate and the display panel, wherein the protective film includes a first protective film and a second protective film, wherein the first protective film is disposed closer to the display panel than the second protective film, and wherein the first protective film includes a polymerizable compound having an adhesive strength that changes with energy irradiated onto the polymerizable compound.

In another aspect, a method of manufacturing a display apparatus comprises disposing a display panel on a substrate; attaching a protective film, including a first protective film having a polymerizable compound and a second protective film, on one of the substrate and the display panel such that the first protective film is closer to the display panel than the second protective film; irradiating energy onto the protective film; and removing the protective film.

In another aspect, a protective film for protecting a display panel, comprises a first protective film; and a second protective film, wherein the first protective film includes a polymerizable compound having an adhesive strength that changes with energy irradiated onto the polymerizable compound, and wherein the protective film is configured to have an adhesive strength of 3.0 gf/inch to 12.5 gf/inch after the energy is irradiated thereto.

Details of other example embodiments are included in the detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1:
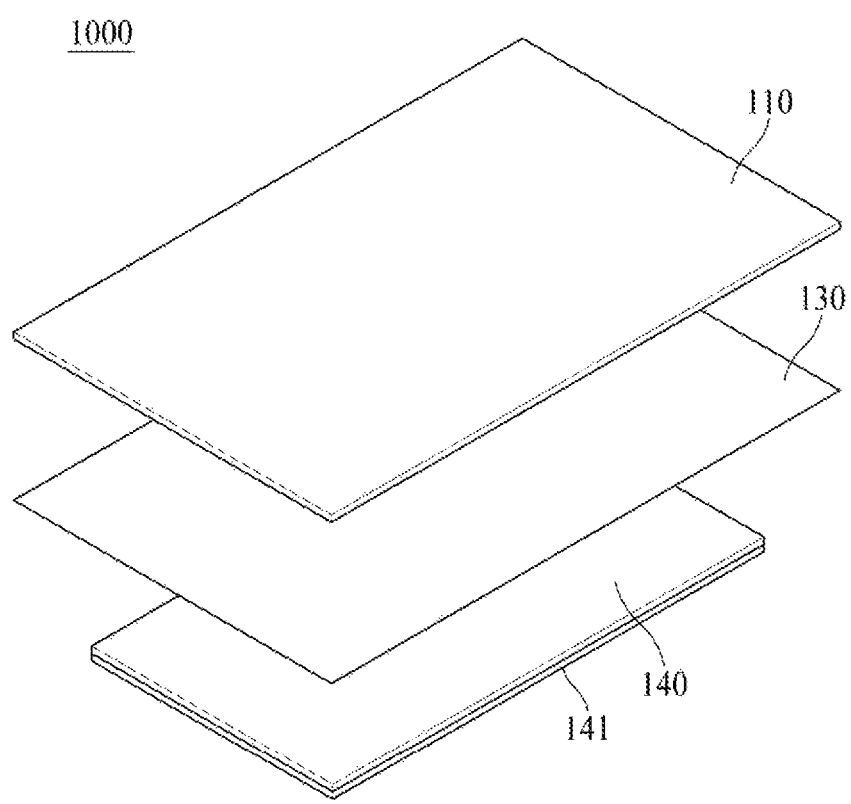
FIG. 1 is a diagram illustrating a display apparatus according to an embodiment of the present disclosure.

Reference will now be made in detail to embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where "comprise," "have," and "include" described in the present specification are used, another part may be added unless "only~" is used. The terms of a singular form may include plural forms unless referred to the contrary.

In construing an element, the element is construed as including an error range although there is no explicit description.

In describing a position relationship, for example, when a position relation between two parts is described as "on~," "over~," "under~," and "next~," one or more other parts may be disposed between the two parts unless "just" or "direct" is used.

In describing a time relationship, for example, when the temporal order is described as "after~," "subsequent~," "next~," and "before~," a case which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
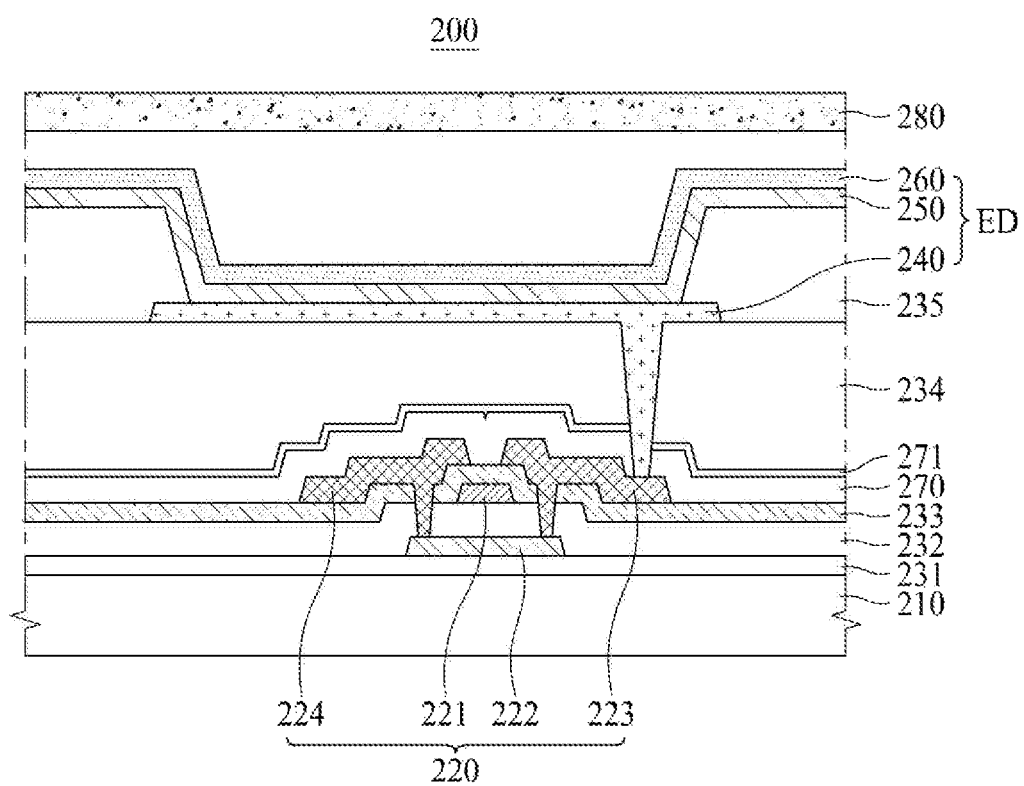
FIG. 2 is a diagram illustrating an example of a display apparatus according to an embodiment of the present disclosure.

FIG. 1 is a diagram illustrating a display apparatus 1000 according to an embodiment of the present disclosure. FIG. 2 is a diagram illustrating an example of the display apparatus 1000 of FIG. 1.

The display apparatus according to an embodiment of the present disclosure may be implemented as various types of display apparatuses. For example, the display apparatus according to an embodiment of the present disclosure may be implemented as a liquid crystal display (LCD) device, an organic light emitting display (OLED) device, an electrophoretic display device, an electro-wetting display device, a quantum dot display device, a micro light emitting display device, or the like. Also, the display device according to an embodiment of the present disclosure may be implemented as a flexible display device, a rollable display device, a bendable display device, a foldable display device, a wearable display device, an automotive display device, or the like.

Hereinafter, an example where the display apparatus is an organic light emitting display device will be described. However, the display apparatus is not limited thereto.

The display apparatus 1000 according to an embodiment of the present disclosure illustrated in FIG. 1 may include a substrate 141 and a display panel 140 disposed on the substrate 141. The substrate 141 may be formed as a substrate including glass having rigidity and a polymer resin or a substrate including a film having flexibility, but is not limited thereto. The film having flexibility may include, for example, plastic and polyimide, but is not limited thereto.

A display panel 140 for displaying an image may be disposed on the substrate 141. A cover window 110 may be disposed on the display panel 140. The cover window 110 may protect elements of the display apparatus 1000 from an external impact applied to the display apparatus 1000. And, an adhesive 130 may attach the display panel 140 on the cover window 110.

An example where the display apparatus according to an embodiment of the present disclosure is an organic light emitting display panel will be described with reference to FIG. 2.

An organic light emitting display panel 200 may include a substrate 210, a thin film transistor (TFT) 220, an anode 240, a light emitting part 250, and a cathode 260. The organic light emitting display panel 200 may include a plurality of pixels. Each of the plurality of pixels may include a plurality of subpixels. Each of the subpixels may be an element for displaying an image and may denote a minimum unit area which actually emits light. Also, a plurality of subpixels may configure a minimum group for displaying white light. For example, three subpixels may configure one group, and a red subpixel R, a green subpixel G, and a blue subpixel B may configure one group. And, the organic light emitting display panel 200 may further include a white subpixel in addition to the red subpixel R, the green subpixel G, and the blue subpixel B. However, the present embodiment is not limited thereto, and various subpixels may be designed. In FIG. 2, for convenience of description, one of a plurality of subpixels configuring the organic light emitting display panel 200 is illustrated.

The substrate 210 may be formed of an insulating material for supporting various elements of the organic light emitting display panel 200. The substrate 210 may be formed as a substrate including glass having rigidity, a substrate having a polymer resin, or a substrate including a film having flexibility, but is not limited thereto. The film having flexibility may include, for example, plastic and polyimide, but is not limited thereto.

When the organic light emitting display panel 200 is applied to a flexible organic light emitting display device, the organic light emitting display panel 200 may be formed of a flexible material, such as plastic or the like. Also, when an organic light emitting device that is easy readily made flexible is applied to a lighting device for vehicles or an automotive display device, a degree of design freedom and various designs of the lighting device for vehicles or the automotive display device may be determined based on a structure or an appearance of a vehicle.

The organic light emitting display device according to an embodiment of the present disclosure may be applied to TVs, mobile devices, tablet personal computers (PCs), monitors, notebook or laptop computers, automotive display devices, etc. Alternatively, the organic light emitting display device according to an embodiment of the present disclosure may be applied to wearable display devices, foldable display devices, rollable display devices, bendable display devices, etc. Also, if the substrate is a flexible substrate, the organic light emitting display device according to an embodiment of the present disclosure may be applied to flexible display devices, foldable display devices, rollable display devices, bendable display devices, wearable display devices, automotive display devices, etc.

A buffer layer 231 for protecting the various elements of the organic light emitting display panel 200 from water ($H_2O$) or oxygen ($O_2$) penetrating from the outside of the substrate 210 may be provided on the substrate 210. Also, whether to form the buffer layer 231 may be determined based on a kind of the substrate 210 or a kind of the TFT 220 applied to the organic light emitting display panel 200. The TFT 220 including an active layer 222, a gate electrode 221, a source electrode 223, and a drain electrode 224 may be provided on the buffer layer 231. This will be described below in detail.

The active layer 222 may be provided on the substrate 210. The active layer 222 may be formed of amorphous silicon (a-Si), polycrystalline silicon (poly-Si), an oxide semiconductor, an organic semiconductor, and/or the like. When the active layer 222 is formed of an oxide semiconductor, the active layer 222 may be formed of indium tin oxide (ITO), indium zinc oxide (IZO), indium gallium zinc oxide (IGZO), or indium tin zinc oxide (ITZO), but the material is not limited to these examples.

A gate insulation layer 232 for insulating the active layer 222 from the gate electrode 221 may be provided on the active layer 222. The gate electrode 221 may act as a switch of the TFT 220. The gate electrode 221 may be formed of a conductive metal, for example, copper (Cu), aluminum (Al), molybdenum (Mo), or an alloy thereof, but the material is not limited to these examples.

The gate insulation layer 232 may not allow a current, flowing in the active layer 222, to flow to the gate electrode 221. The gate insulation layer 232 may be formed of a single layer or a multilayer including silicon oxide (SiOx) or silicon nitride (SiNx), but is not limited thereto.

An interlayer insulation layer 233 for insulating the gate electrode 221 from the source electrode 223 and the drain electrode 224 may be provided. The interlayer insulation layer 233 may be formed of a single layer or a multilayer including SiOx or SiNx, but the interlayer insulation layer 223 is not limited thereto.

The source electrode 223 and the drain electrode 224 which contact the active layer 222 may be provided on the interlayer insulation layer 233. The source electrode 223 and the drain electrode 224 may be electrically connected to the active layer 222. The source electrode 223 and the drain electrode 224 may each be formed of a conductive metal, for example, a metal material, such as Cu, Al, Mo, or an alloy thereof, but the materials are not limited thereto.

In the present disclosure, for convenience of description, only a driving TFT 220 connected to the anode 240 among various TFTs included in the organic light emitting display panel 200 is illustrated. Each of a plurality of subpixels may further include a switching TFT, a capacitor, and/or the like. Also, in the present specification, an example where the TFT 220 has a coplanar structure is described, but the present embodiment is not limited thereto. In other embodiments, a TFT having an inverted staggered structure may be used.

A passivation layer 270 and a planarization layer 234 may be provided on the TFT 220. The passivation layer 270 may be formed of an inorganic material. For example, the passivation layer 270 may be formed of SiOx or SiNx, but other materials may be used.

Moreover, the planarization layer 234 may planarize an upper surface of the substrate 210. The planarization layer 234 may be formed of a single layer or a multilayer and may be formed of an organic material. For example, the planarization layer 234 may be formed of polyimide, acryl, and/or the like. The passivation layer 270 and the planarization layer 234 may include a contact hole for electrically connecting the TFT 220 to the anode 240, in each subpixel.

The anode 240 may be disposed on the planarization layer 234. The anode 240 may be an electrode configured to provide a hole to a light emitting layer configuring the light emitting part 250. The anode 240 may be electrically connected to the TFT 220 through the contact hole of each of the passivation layer 270 and the planarization layer 234, and for example, may be electrically connected to the source electrode 223 of the TFT 220. In FIG. 2, a structure where the anode 240 is connected to the source electrode 223 of the TFT 220 is illustrated, but the anode 240 may be connected to the drain electrode 224 of the TFT 220.

The anode 240 may be provided in each subpixel, and an anode of one subpixel may be spaced apart from an anode of another subpixel. The anode 240 may be formed of a transparent conductive material having a high work function. Examples of the transparent conductive material may include ITO, IZO, etc.

When the organic light emitting display panel 200 according to an embodiment of the present disclosure is a top emission type, the anode 240 may further include a reflective layer so that light emitted from an organic light emitting layer configuring the light emitting part 250 is reflected by the anode 240 and is more smoothly transferred in an up direction. For example, the anode 240 may have a two-layer structure where a transparent conductive layer including a transparent conductive material and a reflective layer are sequentially stacked, or may have a three-layer structure where a transparent conductive layer, a reflective layer, and a transparent conductive layer are sequentially stacked. The reflective layer may include silver (Ag) or an alloy including Ag, and for example, may include Ag or Ag/Pd/Cu (APC).

A bank 235 may be provided on a portion of the anode 240. For example, the bank 235 may be disposed to cover at least a portion of an edge of the anode 240 and may expose a portion of a top of the anode 240. The bank 235 may divide subpixels. That is, the bank 235 may divide pixels each including a plurality of subpixels. In this case, the bank 235 may contact the light emitting part 250. The bank 235 may be formed of an organic material. For example, the bank 235 may be formed of polyimide, acryl, or benzocyclobutene (BCB)-based resin, but the materials are not limited thereto. And, a spacer may be provided on the bank 235. The spacer may prevent an organic light emitting device ED from being damaged by a fine metal mask (FMM) which is used in a process of patterning an organic light emitting layer included in the light emitting part 250.

The cathode 260 may be disposed on the anode 240. The cathode 260 may provide an electron to the organic light emitting layer of the light emitting part 250. The cathode 260 should provide the electron, and thus, may be formed of a conductive material having a low work function. For example, the cathode 260 may be formed of Ag, titanium (Ti), Al, Mo, magnesium (Mg), Ag:Mg, Mg:LiF, and/or the like. And, the cathode 260 may include at least two or more layers.

Also, when the organic light emitting display panel 200 according to an embodiment of the present disclosure is the top emission type, the cathode 260 may include transparent conductive oxide, such as ITO, IZO, indium tin zinc oxide (ITZO), zinc oxide (ZnO), or tin oxide (SnO).

The light emitting part 250 may be disposed between the anode 240 and the cathode 260. Depending on the case, the light emitting part 250 may include various organic layers. For example, the light emitting part 250 may include an organic light emitting layer (EML) and at least one organic layer. The at least one organic layer may include, for example, a hole injection layer (HIL), a hole transport layer (HTL), a hole blocking layer (HBL), an electron injection layer (EIL), an electron transport layer (ETL), an electron blocking layer (EBL), and a charge generation layer (CGL).

And, an encapsulation part 280 may be disposed to cover the organic light emitting device ED. The encapsulation part 280 may protect the organic light emitting device ED from particles, water ($H_2O$), or oxygen ($O_2$) penetrating from the outside or an external impact.

Moreover, an upper substrate may be further provided on the encapsulation part 280. The upper substrate may be formed of glass, a metal material, or a flexible film including a polyimide-based material. The substrate 210 and the upper substrate may be fixed by the encapsulation part 280.

A process of manufacturing the display apparatus illustrated in FIG. 1 may be divided into a process of manufacturing a display panel and a process of manufacturing a cover window and the like. In the process of manufacturing the display apparatus, a protective film may be attached on a substrate, a display panel, or a cover window, and then, a manufacturing process may be performed, for protecting the substrate, the display panel, or the cover window. The protective film decreases particles, smears, or scratches, which contaminate a surface of the substrate, the display panel, or the cover window. And, the protective film may be removed from the substrate, the display panel, or the cover window, and then, by bonding the cover window to the display panel, the display apparatus may be finished. Therefore, an example of attaching the protective film and removing the protective film will be described below with reference to FIGS. 3A and 3B.

Figure 3A:
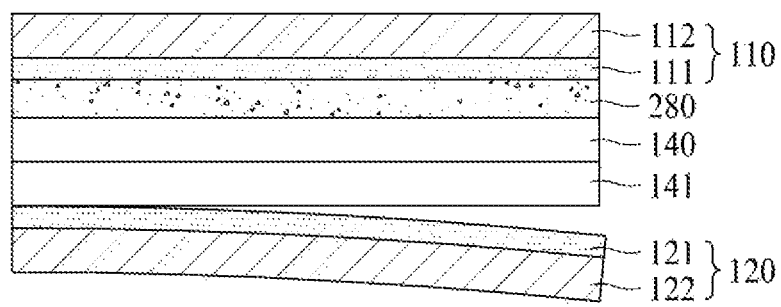
FIGS. 3A and 3B are diagrams for describing an example of removing a protective film in a display apparatus according to an embodiment of the present disclosure.
Figure 3B:
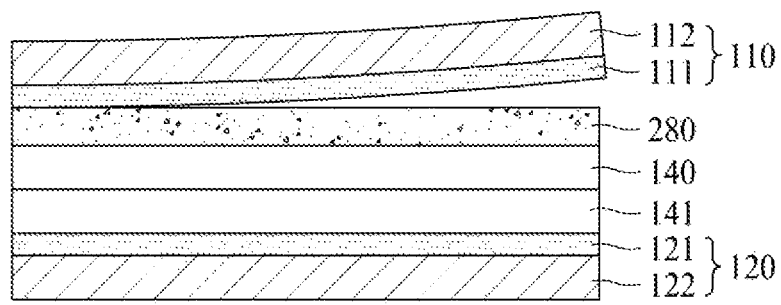

FIGS. 3A and 3B are diagrams for describing an example of removing a protective film in a display apparatus according to an embodiment of the present disclosure.

With reference to FIGS. 3A and 3B, an upper protective film 110 may be disposed on a display panel 140, and a lower protective film 120 may be disposed under a substrate 141. In order to protect the display panel 140 or the substrate 141, the upper protective film 110 or the lower protective film 120 may be attached on the display panel 140 or the substrate 141, and then, a process of manufacturing a display apparatus may be performed. For example, the process of manufacturing the display apparatus may be variously performed in a state where the upper protective film 110 or the lower protective film 120 is attached on the display panel 140 or the substrate 141. And, the upper protective film 110 and the lower protective film 120 may be referred to as a protective film.

Moreover, after a protective film is removed, a backplate may be attached on a bottom of the substrate 141, and when one or more of a cover window, a touch panel, and a polarizer corresponding to a functional layer is/are bonded to the display panel 140, the display apparatus may be finished. The lower protective film 120 may include a first protective film 121 and a second protective film 122, and the upper protective film 110 may include a third protective film 111 and a fourth protective film 112.

FIG. 3A is a diagram for describing an example of removing the lower protective film 120 from the substrate 141. The lower protective film 120 may be removed, and then, the backplate may be attached on the bottom of the substrate 141.

A range of an adhesiveness or an adhesive strength of the lower protective film 120 may vary based on a characteristic or thickness of a base material being protected, and thus, may include various ranges and may be variable. For example, the adhesiveness or the adhesive strength of the lower protective film 120 may be 20.0 gf/inch to 300.0 gf/inch.

When the lower protective film 120 is removed from the substrate 141, the lower protective film 120 cannot sufficiently be removed from the substrate 141 due to an adhesiveness or an adhesive strength of the first protective film 121 included in the lower protective film 120. For this reason, if the first protective film 121 is not sufficiently removed from the substrate 141, a residual of the first protective film 121 remains on a bottom of the substrate 141. In a case of attaching the backplate on the substrate 141 from which the first protective film 121 has been removed, the backplate is not attached on the substrate 141 due to the residual of the first protective film 121. Moreover, the inventors have recognized that a cathode, which is a layer included in the display panel 140, is partially detached or lifted when the lower protective film 120 is removed from the substrate 141.

FIG. 3B is a diagram for describing an example of removing the upper protective film 110 from the encapsulation part 280.

A range of an adhesiveness or an adhesive strength of the upper protective film 110 may vary based on a characteristic or thickness of a base material being protected, and thus, may include various ranges and may be variable. For example, the adhesiveness or an adhesive strength of the upper protective film 110 may be 20.0 gf/inch to 300.0 gf/inch.

When the upper protective film 110 is removed from the encapsulation part 280, layers under the upper protective film 110 should not be peeled. The upper protective film 110 cannot sufficiently be removed from the encapsulation part 280 due to an adhesiveness or an adhesive strength of the third protective film 111 included in the upper protective film 110. Therefore, the inventors have recognized that the layers under the upper protective film 110 are peeled. For example, a cathode which is a layer under the upper protective film 110 is partially detached or lifted.

And, when the upper protective film 110 is removed from the display panel 140, the substrate 141 or the backplate attached on the bottom of the substrate 141 is damaged, and due to this, the display panel 140 or the substrate 141 is not protected from an external impact.

Therefore, because the protective film should support a base material (for example, the substrate, the display panel, and the functional layer) that should be protected during manufacturing of the display apparatus, the protective film should not be detached or separated from the base material. For example, the protective film should have a certain adhesiveness or an adhesive strength to not be detached or separated from the base material. Therefore, an adhesiveness or an adhesive strength before the protective film is removed should be maintained, and an adhesiveness or an adhesive strength when the protective film is removed should be lower than an adhesiveness or an adhesive strength before the protective film is removed, and thus, it is very difficult to satisfy a range of an adhesiveness or an adhesive strength of the protective film suitable for the process of manufacturing the display apparatus.

Therefore, the inventors have recognized the above-described problems and have done various experiments for developing a protective film that maintains an adhesiveness or an adhesive strength for protecting a base material which should be protected in a process of manufacturing a display apparatus, and has an adhesiveness or an adhesive strength that is reduced when removing the protective film from the base material being protected. Through the various experiments, the inventors have invented a protective film in which layers configuring a display panel or layers under the protective film are not damaged, and an adhesiveness or an adhesive strength of the protective film is reduced in order for a residual of the protective film to be reduced when removing the protective film.

In description below, an upper protective film and a lower protective film may be referred to as a protective film. Also, a first protective film and a third protective film may be referred to as a first protective film, and a second protective film and a fourth protective film may be referred to as a second protective film.

An example where a protective film according to an embodiment of the present disclosure is applied will be described below with reference to FIGS. 4 and 5. FIGS. 4 and 5 are diagrams for describing an example of attaching a functional layer after removing a protective film according to an embodiment of the present disclosure.

Figure 4A:
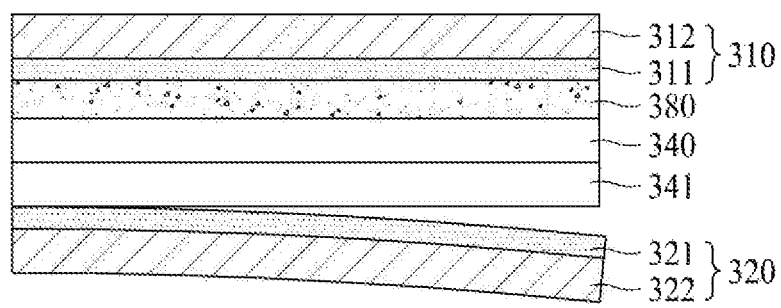
FIGS. 4A and 4B are diagrams for describing an example of attaching a functional layer after removing a protective film in a display panel according to an embodiment of the present disclosure.
Figure 5A:
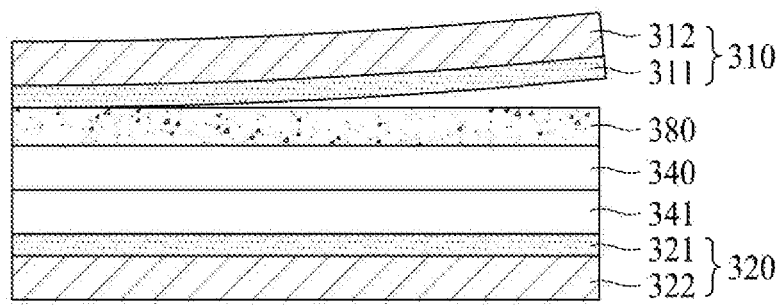
FIGS. 5A and 5B are diagrams for describing an example of attaching a functional layer after removing a protective film in a display panel according to an embodiment of the present disclosure.

With reference to FIGS. 4A and 5A, a lower protective film 320 including a first protective film 321 and a second protective film 322 may be disposed under a substrate 341. Also, the lower protective film 320 may protect the substrate 341 during manufacturing of a display panel 340. The substrate 341 may be a polyimide film, but the substrate 341 is not limited thereto.

The display panel 340 may be provided on the substrate 341 on which the lower protective film 320 is disposed, and an encapsulation part 380 may be provided on the display panel 340. An upper protective film 310 including a third protective film 311 and a fourth protective film 312 may be disposed on the encapsulation part 380. Also, the upper protective film 310 may be disposed on the encapsulation part 380 and may protect the display panel 340 including the encapsulation part 380 in a process of manufacturing a display apparatus. Also, the lower protective film 320 including the first protective film 321 and the second protective film 322 may be disposed under the substrate 341. Alternatively, the lower protective film 320 may be removed, and a backplate which is a functional layer may be disposed under the substrate 341.

And, the first protective film 321 and the third protective film 311 may be disposed closer adjacent to the display panel 340 than the second protective film 322 and the fourth protective film 312.

And, the first protective film 321 and the third protective film 311 may each include a polymerizable compound having an adhesiveness or an adhesive strength capable of by varying an applied energy. The polymerizable compound may lower a curing degree or a curing rate to which each of the first protective film 321 and the third protective film 311 is cured, based on ultraviolet light (UV), which is energy, thereby decreasing the adhesiveness or an adhesive strength. The polymerizable compound may be, for example, a multi-functional monomer. In comparison with a mono-functional monomer, the adhesiveness or an adhesive strength of the multi-functional monomer is reduced through energy irradiation. The mono-functional monomer may be, for example, methyl methacrylate represented by Formula 1, but the material used is not limited thereto.

[Formula 1]

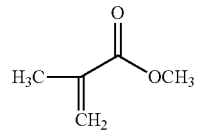

And, the multi-functional monomer may be dipentaerylthritol hexaacrylate represented by Formula 2, but the material is not limited thereto.

[Formula 2]

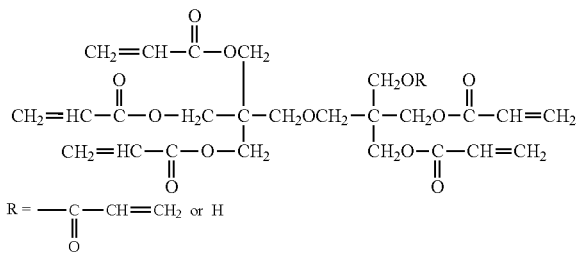

In comparison with the mono-functional monomer, the adhesiveness or an adhesive strength of the multi-functional monomer is reduced through energy irradiation. Also, a cross-linking density of the multi-functional monomer is enhanced by a cross-linking reaction when irradiating energy, and thus, a coupling force or a bonding force in the first protective film 321 and the third protective film 311 is strengthened. For this reason, an adhesiveness or an adhesive strength between each of the first and third protective films 321 and 311 and a base material attached thereon is weakened, and for example, an adhesiveness or an adhesive strength between each of the first and third protective films 321 and 311 and the display panel, the encapsulation part, or the substrate attached thereon is weakened. Therefore, it is easy to remove the protective film from the display panel, the encapsulation part, or the substrate, and thus, when removing the protective film, the residual of the protective film is prevented, or layers under the protective film or layers configuring the display panel are prevented from being damaged.

Each of the first protective film 321 and the third protective film 311 may further include a photo-initiator or an additive. The photo-initiator may be added at 0.1 wt % to 10 wt % with respect to 100 wt % of a polymerizable compound. For example, the photo-initiator may be added by 0.1 wt % to 5 wt %. Further, the photo-initiator may be one among an acetophenone-based compound, a benzoin ether-based compound, an acryl phosphine oxide-based compound, a benzophenone, a benzyl ketal-based compound, an α-hydroxyalkylphenone-based compound, and an α-amino acetophenone-based compound, or may include two or more compounds thereof. The additive may be added by 0.1 wt % to 1 wt % with respect to 100 wt % of the polymerizable compound. Examples of the additive may include a cross-linking agent, a UV stabilizer, an antioxidant, a toning agent, a reinforcing agent, a filler, an antifoaming agent, a surfactant, and a plasticizer, but the additive is not limited thereto.

The polymerizable compound included in each of the first protective film and the third protective film may be configured to have an adhesiveness or an adhesive strength which is more reduced through energy irradiation than before irradiating energy. And, the inventors have recognized that the protective film should be configured to have an adhesiveness or an adhesive strength which prevents a cathode from being partially detached or lifted in a process of removing the protective film. An experimental result relevant thereto will be described with reference to Table 1.

TABLE 1

| | Experimental Example 1 | Experimental Example 2 | Experimental Example 3 |
| --- | --- | --- | --- |
| Adhesiveness (gf/inch) | 57.0 | 12.5 | 6.0 |
| Partial Detachment of cathode | 2/20 | 0/30 | 0/15 |

Table 1 shows a result obtained by measuring an adhesiveness or an adhesive strength of the lower protective film and a partial detachment defect or a lifting defect of a cathode when a sample is manufactured with reference to FIG. 3A for example, and then, the lower protective film is removed. The sample corresponds to an example where the upper protective film is provided on the encapsulation part, and the lower protective film is provided under the encapsulation part.

Using a universal testing machine (UTM), an adhesiveness or an adhesive strength has been measured through a 180-degree peel test under a condition where a peeling speed is adjusted to 10 mm/sec.

In the experimental example 1, twenty samples have been prepared, a thickness of the third protective film 311 of the upper protective film has been adjusted to 32 μm, and a thickness of the fourth protective film 312 of the upper protective film has been adjusted to 38 μm. In the experimental example 2, thirty samples have been prepared, a thickness of the third protective film 311 has been adjusted to 12 μm, and a thickness of the fourth protective film 312 has been adjusted to 38 μm. In the experimental example 3, fifteen samples have been prepared, a thickness of the third protective film has been adjusted to 20 μm, and a thickness of the fourth protective film has been adjusted to 125 μm. The thickness of the third protective film 311 and the thickness of the fourth protective film 312 are values for experiments. However, the present embodiment is not limited to these examples. The experiments are for checking an adhesiveness or an adhesive strength that causes a partial detachment defect or a lifting defect of a cathode, and the adhesiveness or the adhesive strength may vary based on the thickness of the third protective film and the thickness of the fourth protective film.

In the experimental example 1, the adhesiveness or an adhesive strength is 57.0 gf/inch, and in this case, the partial detachment defect or the lifting defect of the cathode has been detected from two of the twenty samples. In Table 1, 2/20 denotes the partial detachment defect or the lifting defect of the cathode, 20 denotes the total number of samples, and 2 denotes the number of samples from which the partial detachment defect or the lifting defect of the cathode has been detected. Similar to the experiment example 1, the experimental example 2 and the experimental example 3 are shown.

In the experimental example 2, the adhesiveness or an adhesive strength is 12.5 gf/inch, and the partial detachment defect or the lifting defect of the cathode has not been detected from all of the thirty samples. In the experiment example 3, the adhesiveness or the adhesive strength is 6.0 gf/inch, and the partial detachment defect or the lifting defect of the cathode has not been detected from all of the fifteen samples. Through the experiments, it can be seen that the adhesiveness or the adhesive strength of the lower protective film should be adjusted to 12.5 gf/inch, for preventing the partial detachment defect or the lifting defect of the cathode when removing the lower protective film from the substrate.

And, through the experiments, the inventors have recognized that the adhesiveness or the adhesive strength of the protective film should be adjusted to 3.0 gf/inch or more, in order for the protective film not to be detached or separated from the substrate. If the adhesiveness or the adhesive strength of the protective film is less than 3.0 gf/inch, the protective film is detached or separated from the substrate or the functional layer in a process of manufacturing a display apparatus with the protective film attached thereon.

Therefore, the adhesiveness or the adhesive strength of the protective film after irradiating with energy may be within a range of 3.0 gf/inch to 12.5 gf/inch, and thus, the adhesiveness or the adhesive strength of the protective film is maintained in order for the protective film not to be detached or separated in the process of manufacturing the display apparatus. Also, when removing the protective film, the cathode is prevented from being partially detached or lifted, or the functional layer under the substrate is prevented from being peeled.

And, a wavelength of UV that is energy irradiated onto the first and third protective films may be 365 nm. The adhesiveness or the adhesive strength may vary based on an intensity of the irradiated UV. An irradiation energy of the UV corresponds to a multiplication of an irradiation intensity and an irradiation time, and the adhesiveness or the adhesive strength may vary based on the irradiation time. An experimental result relevant thereto will be described with reference to Table 2.

TABLE 2

|  | Irradiation Time | | |
| --- | --- | --- | --- |
|  | 1 sec | 10 sec | 15 sec |
| Adhesiveness (gf/inch) | 3.8 | 13.2 | 16.4 |

Table 2 shows a result obtained by experimenting on a sample where the encapsulation part is provided on a polyimide film, and then, the third protective film and the fourth protective film included in the upper protective film are provided on the encapsulation part. A thickness of the third protective film is 20 μm, and a thickness of the fourth protective film is 50 μm. However, the present embodiment is not limited to the thicknesses. Also, the adhesiveness or an adhesive strength of the protective film before irradiating energy has been measured as 70 gf/inch. By using the UTM, the adhesiveness or an adhesive strength has been measured through a 180-degree peel test under a condition where a peel-off speed is adjusted to 10 mm/sec.

If an irradiation time for which energy is irradiated onto the protective film is shortened, a polymerizable compound included in the protective film is not cured, and thus, the adhesiveness or an adhesive strength is enhanced. And, if the irradiation time increases, the polymerizable compound included in the protective film is over-cured, and thus, the adhesiveness or an adhesive strength is enhanced.

As shown in Table 2, it can be seen that the adhesiveness or an adhesive strength of the protective film when the irradiation time is 1 second is 3.8 gf/inch, the adhesiveness of the protective film when the irradiation time is 10 seconds is 13.2 gf/inch, and the adhesiveness or an adhesive strength of the protective film when the irradiation time is 15 seconds is 16.4 gf/inch. Therefore, it can be shown that the adhesiveness or an adhesive strength is more reduced than 70 gf/inch which is the adhesiveness or an adhesive strength before irradiating energy. And, it can be shown that the adhesiveness or an adhesive strength is less in a case, where the irradiation time is 1 sec, than a case where the irradiation time is 10 second or 15 second. Therefore, if the irradiation time for which energy is irradiated onto the protective film is 0.1 second to 1 second, the adhesiveness or an adhesive strength of the protective film is reduced. And, the irradiation intensity or the irradiation time of UV may be adjusted so that the adhesiveness or an adhesive strength of the protective film is within a range of 3.0 gf/inch to 12.5 gf/inch.

Figure 4B:
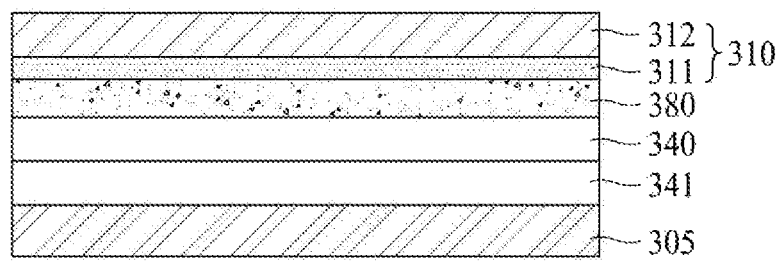

With reference to FIG. 4A, an example is illustrated where the lower protective film 320 attached on a bottom of the substrate 341 is removed. After the display panel 340 is provided on the substrate 341, the lower protective film 320 may be removed. The first protective film 321 included in the lower protective film 320 may include a polymerizable compound. And, FIG. 4B is a diagram illustrating an example where a first functional layer 305 is attached on the substrate 341 from which the lower protective film 320 has been removed. The first functional layer 305 may be attached on the substrate 341. The first functional layer 305 may be a backplate, but it is not limited thereto. The backplate may be a substrate which supports the display panel 340, and may protect the display panel 340 from an external environment. The backplate may have a flat plate shape and may be formed of metal or plastic having good durability to protect the display panel 340 from an external impact, but the backplate is not limited thereto. And, the backplate may be attached on the substrate 341 by an adhesive. Also, a protective film may be further provided under the backplate. The protective film may protect the backplate.

Figure 5B:
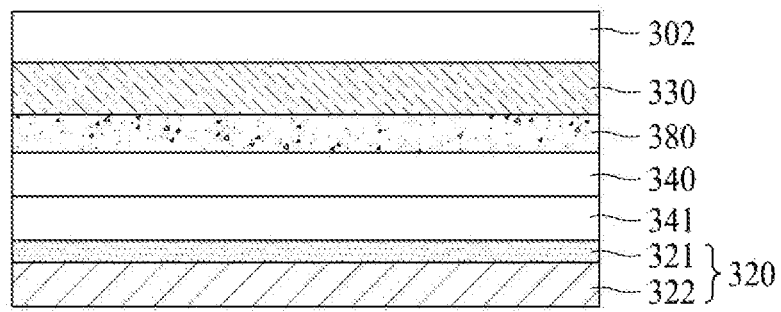

With reference to FIG. 5A, an example of removing the upper protective film 310 attached on the encapsulation part 380 is illustrated. The protective film 310 may be removed in a process of attaching a functional layer on the encapsulation part 380. The third protective film 311 included in the upper protective film 310 may include a polymerizable compound. And, FIG. 5B is a diagram illustrating an example where a second functional layer 302 is attached on the encapsulation part 380 from which the upper protective film 310 has been removed. The second functional layer 302 may be attached on the encapsulation part 380 by an adhesive 330. The adhesive 330 may be one among an optically clear adhesive (OCA), an optically clear resin (OCR), and a pressure sensitive adhesive (PSA), but the adhesive 330 is not limited thereto.

The second functional layer 302 may be one among a cover window, a touch panel, and a polarizer, or a combination thereof, but is not limited to these examples. For example, the touch panel may be disposed on the encapsulation part 380, and the polarizer may be disposed on the touch panel. In this case, the protective film described above with reference to FIGS. 4 and 5 may be included in the touch panel, for protecting the touch panel in a process of manufacturing the display panel. The protective film attached to the touch panel may be removed, and then, the polarizer may be attached on the encapsulation part 380 by an adhesive. And, the polarizer may be attached on the touch panel. And, the cover window may include the protective film described above with reference to FIGS. 4 and 5. The protective film attached on the cover window may be removed, and then, the cover window may be attached on the polarizer by an adhesive. An example of the display apparatus will be described below with reference to FIGS. 7 to 10.

And, in the display apparatus according to an embodiment of the present disclosure, one among the substrate, the backplate, the polarizer, the cover window, and the touch panel may have flexibility. And, the display panel according to an embodiment of the present disclosure may be one among a liquid crystal panel, an organic light emitting display panel, a touch panel, a touch panel disposed on a liquid crystal panel, and a touch panel disposed on an organic light emitting display panel, but is not limited thereto.

Hereinafter, a method of manufacturing a display apparatus according to an embodiment of the present disclosure will be described with reference to FIGS. 6A to 6F. FIGS. 6A to 6F are diagrams for describing a method of manufacturing a display apparatus according to an embodiment of the present disclosure.

First, the method may include a step of disposing a lower protective film 320, including a first protective film 321 including a polymerizable compound and a second protective film 322, under a substrate 341. The lower protective film 320 may protect the substrate 341 in a process of manufacturing a display panel 340. The substrate 341 may be a polyimide film, but is not limited thereto.

Figure 6A:
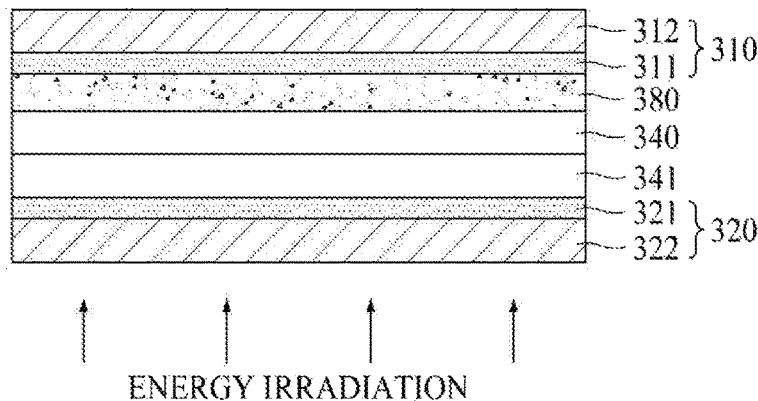
FIGS. 6A to 6F are diagrams for describing a method of manufacturing a display apparatus according to an embodiment of the present disclosure.

With reference to FIG. 6A, the method may include a step of disposing the display panel 340 on the substrate 341 with the lower protective film 320 attached thereon. And, an encapsulation part 380 may be formed on the display panel 340. And, an upper protective film 310 may be attached on the encapsulation part 380. The upper protective film 310 may protect the encapsulation part of the display panel 340. The upper protective film 310 may include a third protective film 311 including a polymerizable compound and a fourth protective film 312.

The second protective film 322 and the fourth protective film 312 may each be formed of polyethylene terephthalate (PET). The second protective film 322 and the fourth protective film 312 may each be a temporary protective film (TPF). And, a thickness of each of the second protective film 322 and the fourth protective film 312 may be 30 µm to 130 µm, but is not limited thereto. And, a thickness of each of the first protective film 321 and the third protective film 311 may be 10 µm to 40 µm, but the thickness is not limited thereto. And, the first protective film 321 and the third protective film 311 may each include a polymerizable compound. The polymerizable compound may include dipentaerylthritol hexaacrylate which is a multi-functional monomer. The first protective film 321 and the third protective film 311 may each further include a photo-initiator and an additive.

And, the method may include a step of irradiating energy onto one of the lower protective film 320 and the upper protective film 310. FIG. 6A illustrates a step of irradiating the energy onto the lower protective film 320. The energy may be UV. The UV may have a wavelength of 365 nm, the irradiation energy may be 1,000 mJ/cm$^2$, and an irradiation time may be 1 second or less. Or, the irradiation time may be 0.2 second to 1 second. A lamp used to irradiate the energy may be mercury (Hg), metal halide, or a light emitting diode (LED), and for example, in order to reduce damage of an organic light emitting device, metal halide or an LED may be used. Also, an irradiation intensity or an irradiation time of UV may be adjusted so that an adhesiveness or an adhesive strength of the lower protective film 320 is within a range of 3.0 gf/inch to 12.5 gf/inch.

A cross-linking density of a multi-functional monomer included in the first protective film 321 is enhanced by a cross-linking reaction when irradiating UV which is energy, and thus, a coupling force or a bonding force of the first protective film 321 is strengthened. For this reason, an adhesiveness or an adhesive strength between the substrate 341 and the first protective film 321 is weakened.

Figure 6B:
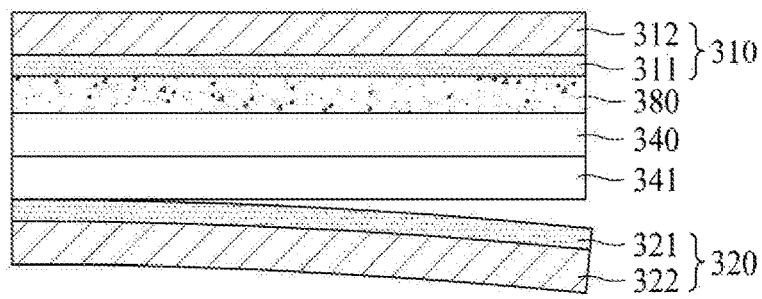

And, the method may include a step of removing the lower protective film 320 or the upper protective film 310. FIG. 6B illustrates a step of removing the lower protective film 320 from the substrate 341. The step of removing the lower protective film 320 may include a step where an adhesiveness or an adhesive strength of the lower protective film 320, e.g., an adhesiveness or an adhesive strength of the polymerizable compound included in the first protective film 321, is reduced by the energy, and thus, the lower protective film 320 is removed from the substrate 341. Therefore, because the adhesiveness or an adhesive strength of the lower protective film 320 is weakened by the irradiation energy, the lower protective film 320 may be easily removed from the substrate 341. Therefore, a residual, remaining on a bottom of the substrate 341 of the first protective film 321 included in the lower protective film 320, or a partial detachment defect or a lifting defect of layers, for example, a cathode, configuring the display panel 340 is prevented. Accordingly, a yield ratio of the display apparatus is enhanced.

Figure 6C:
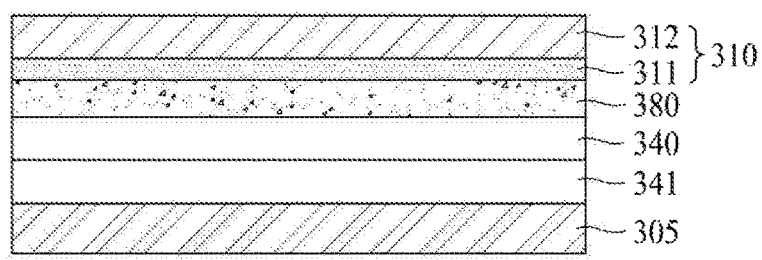

Subsequently, the method may include a step of attaching a functional layer on the bottom of the substrate, from which the lower protective film has been removed, or the display panel from which the upper protective film has been removed. FIG. 6C illustrates a step of attaching a first functional layer 305 on the substrate 341 from which the lower protective film 320 has been removed. And, the first functional layer 305 may be a backplate, but is not limited thereto. And, the backplate may be attached on the substrate 341 by an adhesive. And, a protective film may be further provided under the backplate. The protective film may protect a backplate.

Figure 6D:
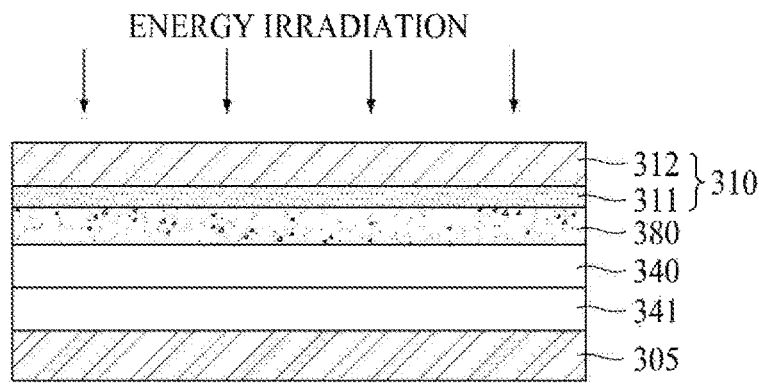

With reference to FIG. 6D, the method may include a step of irradiating energy onto the upper protective film after attaching the first functional layer 305 on the substrate 341 from which the lower protective film 320 has been removed. The energy may be UV. The UV may have a wavelength of 365 nm, the irradiation energy may be 1,000 mJ/cm$^2$, and an irradiation time may be 1 second or less. Or, the irradiation time may be 0.2 seconds to 1 second. A lamp used to irradiate the energy may be mercury (Hg), metal halide, or an LED, and for example, to reduce damage of the organic light emitting device, metal halide or an LED may be used. And, irradiation intensity or irradiation time of UV may be adjusted so that an adhesiveness or an adhesive strength of the upper protective film 310 is within a range of 3.0 gf/inch to 12.5 gf/inch.

A cross-linking density of a multi-functional monomer included in the third protective film 311 is enhanced by a cross-linking reaction when irradiating UV which is energy, and thus, a coupling force or a bonding force of the third protective film 311 is strengthened. For this reason, an adhesiveness or an adhesive strength between the encapsulation part 380 and the third protective film 311 is weakened.

Figure 6E:
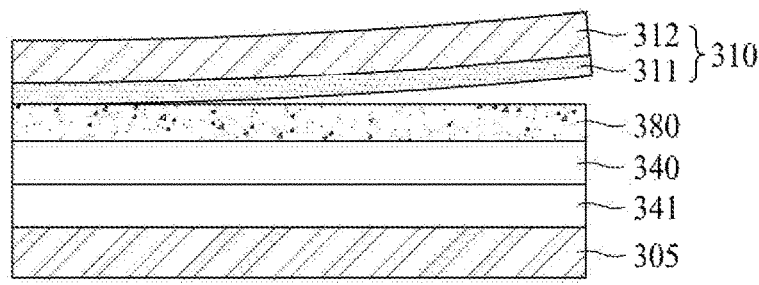

And, as illustrated in FIG. 6E, the method may include a step of removing the upper protective film 310 from the encapsulation part 380. The step of removing the upper protective film 310 may include a step where an adhesiveness or an adhesive strength of the upper protective film 310, e.g., an adhesiveness or an adhesive strength of the polymerizable compound included in the third protective film 311, is reduced by the energy, and thus, the upper protective film 310 is removed from the display panel 340. Therefore, because the adhesiveness or an adhesive strength of the upper protective film 310 is weakened by the irradiation energy, the upper protective film 310 may be easily removed from the encapsulation part 380. Therefore, damage of a backplate which is the first functional layer 305 under the substrate 341, a partial detachment defect or a lifting defect of layers under the upper protective film 310, or a partial detachment defect or a lifting defect of layers, for example, a cathode, configuring the display panel 340 is prevented. Accordingly, a yield ratio of display apparatus is enhanced.

Figure 6F:
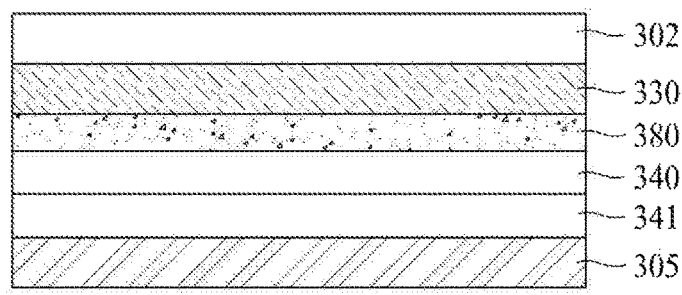

Subsequently, as illustrated in FIG. 6F, the method may include a step of attaching the second functional layer 302 on the encapsulation part 380 from which the upper protective film 310 has been removed. The second functional layer 302 may be attached on the encapsulation part 380 by the adhesive 330. The adhesive 330 may be one among an OCA, an OCR, and a PSA, but is not limited thereto.

The second functional layer 302 may be one among a cover window, a touch panel, and a polarizer, or a combination thereof, but is not limited thereto. An example relevant thereto will be described below with reference to FIGS. 7 to 10.

For example, the touch panel may be disposed on the encapsulation part 380, and the polarizer may be disposed on the touch panel. In this case, a protective film may be included in the touch panel, for protecting the polarizer in a process of manufacturing the display panel. The touch panel may be disposed on the encapsulation part 380 by using an adhesive, and after the protective film attached on the polarizer is removed, the polarizer may be attached on the touch panel. And, the cover window may be attached on the polarizer by an adhesive.

As another example, the polarizer may be disposed on the encapsulation part 380. In this case, a protective film may be included in the touch panel, for protecting the polarizer in a process of manufacturing the display panel. The protective film attached on the polarizer may be removed, and then, the touch panel may be attached on the polarizer by an adhesive. And, the cover window may be attached on the touch panel by an adhesive.

FIGS. 7 to 10 are diagrams illustrating an example of a display apparatus where a backplate and/or a functional layer is attached through a final process for the display apparatus after the protective film described above with reference to FIGS. 4A to 6F is attached. After a process of manufacturing the display apparatus is performed in a state where the protective film is attached on a bottom of a substrate, the protective film may be removed from the substrate, and the backplate may be attached on the bottom of the substrate through a subsequent process. And, the backplate may be attached on the substrate by an adhesive. Also, when a functional layer is attached on a display panel through a subsequent process in a state where the protective film is attached on the display panel, the protective film may be removed from the display panel, and the functional layer may be attached on the display panel from which the protective film has been removed. Through such processes, the display apparatus may be finished.

And, a process of irradiating energy onto the lower protective film and then irradiating the energy onto the upper protective film has been described in a manufacturing process illustrated in FIGS. 6A to 6F, but the present embodiment is not limited thereto. For example, a process of irradiating the energy onto the upper protective film and then irradiating the energy onto the lower protective film may be performed. A subsequent process may be performed identically description with reference to FIGS. 6B to 6F. As another example, as in FIG. 6A, the energy may be simultaneously irradiated onto the lower protective film and the upper protective film, and then, a protective film having a weak adhesiveness or an adhesive strength may be first removed. If an adhesiveness or an adhesive strength of the upper protective film is weaker than that of the lower protective film, the upper protective film may be removed prior to the lower protective film, and then, a process of attaching a functional layer on the display panel from which the upper protective film has been removed may be performed. And, after the process of attaching the functional layer on the display panel, the lower protective film may be removed, and a process of attaching the functional layer on the substrate from which the lower protective film has been removed may be performed.

Therefore, the method of manufacturing the display apparatus according to an embodiment of the present disclosure may include attaching the lower protective film including the first protective film having a polymerizable compound and the second protective film, on the bottom of the substrate, disposing the display panel on the substrate, attaching the upper protective film including the third protective film having a polymerizable compound and the fourth protective film, on the display panel, irradiating the energy onto one of the lower protective film and the upper protective film, removing the lower protective film or the upper protective film, and attaching the functional layer on the bottom of the substrate, from which the lower protective film has been removed, or the display panel from which the upper protective film has been removed.

Figure 7:
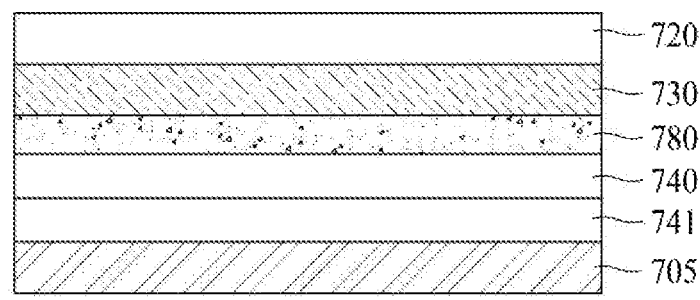
FIG. 7 is a diagram illustrating an example of a display apparatus according to an embodiment of the present disclosure.

FIG. 7 is a diagram illustrating an example of a display apparatus according to an embodiment of the present disclosure.

With reference to FIG. 7, a display panel 740 may be disposed on a substrate 741, and an encapsulation part 780 may be disposed on the display panel 740. A backplate 705 may be disposed under the substrate 741. And, a cover window 720 which is a functional layer may be disposed on the encapsulation part 780 using an adhesive 730. The adhesive 730 may be one among an OCA, an OCR, and a PSA, but is not limited thereto.

A protective film described above with reference to FIGS. 4A to 6F may be attached on the substrate 741. The protective film decreases particles, smears, or scratches, which contaminate a surface of the substrate 741. And, the display panel 740 may be provided on the substrate 741, the protective film may be removed from the substrate 741, and the backplate 705 may be attached on a bottom of the substrate 741. The backplate 705 may be attached on the substrate 741 by an adhesive.

A protective film described above with reference to FIGS. 4A to 6F may be attached on the cover window 720. The protective film decreases particles, smears, or scratches, which contaminate a surface of the cover window 720. Also, in a case of attaching a functional layer on the display panel 740, the protective film may be removed from the encapsulation part 780, the protective film may be removed from the cover window 720, and the cover window 720 may be attached on the encapsulation part 780 by the adhesive 730.

The cover window 720 may protect the internal elements of the display apparatus from an external impact applied to the display apparatus. Also, the cover window 720 may be formed of glass having good rigidity or a film having a flexibility of a material such as plastic which is capable of thermal molding and has good processability. For example, the cover window 720 may be formed of glass, tempered glass, PET, and/or the like, but is not limited thereto. Glass or tempered glass may be, for example, one of sapphire glass and gorilla glass, or may have a junction structure thereof.

And, the cover window 720 may be configured to act as a touch panel. For example, at least one ITO film including a rear surface on which an ITO electrode and the like are disposed may be disposed on the cover window 720. And, the cover window 720 may be configured as the touch panel which generates an electrical signal through an operation where ITO electrodes of two or more ITO films spaced apart from each other are brought in contact with each other by pressure applied to surfaces thereof.

Figure 8:
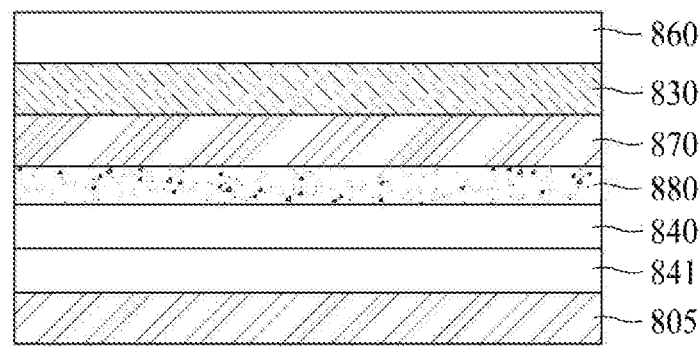
FIG. 8 is a diagram illustrating another example of a display apparatus according to an embodiment of the present disclosure.

FIG. 8 is a diagram illustrating another example of a display apparatus according to an embodiment of the present disclosure.

With reference to FIG. 8, a display panel 840 may be disposed on a substrate 841, and an encapsulation part 880 may be disposed on the display panel 840. A backplate 805 may be disposed under the substrate 841. And, a polarizer and a touch panel which are functional layers may be disposed on the encapsulation part 880. For example, a polarizer 870 may be disposed on the encapsulation part 880. The polarizer 870 may prevent external light from being reflected from the display panel 840. And, a touch panel 860 may be disposed on the polarizer 870 using an adhesive 830. The adhesive 830 may be one among an OCA, an OCR, and a PSA, but the adhesive 830 is not limited thereto.

A protective film as described above with reference to FIGS. 4A to 6F may be attached on the substrate 841. The protective film decreases particles, smears, or scratches, which may contaminate a surface of the substrate 841. And, the protective film may be removed from the substrate 841, and then, the backplate 805 may be attached on a bottom of the substrate 841. The backplate 805 may be attached on the substrate 841 by an adhesive.

A protective film described above with reference to FIGS. 4A to 6F may be attached on the touch panel 860. The protective film decreases particles, smears, or scratches, which contaminate a surface of the touch panel 860. And, the protective film may be removed from the touch panel 860, and then, the touch panel 860 may be attached on the polarizer 870 by the adhesive 830.

And, the touch panel 860 may be one among an electrostatic capacitive type, a resistive type, an electro-magnetic type, a saw type, and an infrared type. And, in the touch panel 860, a touch electrode may be provided on a substrate including glass having rigidity, or may be provided on a film having flexibility. And, the substrate 841, the polarizer 870, and the touch panel 860 may each be formed of a film having flexibility.

Figure 9:
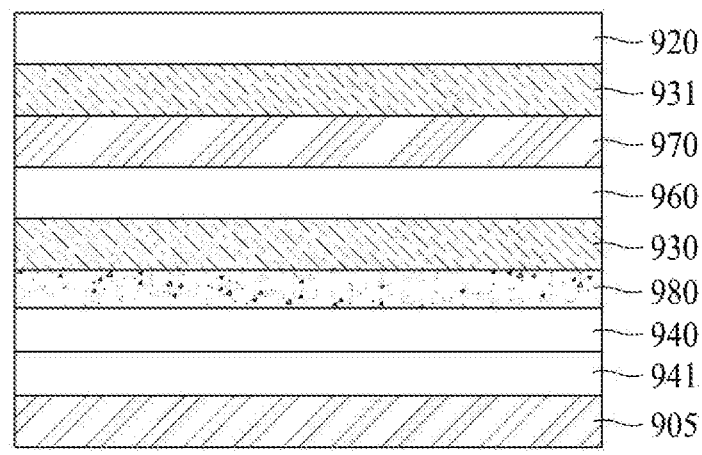
FIG. 9 is a diagram illustrating another example of a display apparatus according to an embodiment of the present disclosure.

FIG. 9 is a diagram illustrating another example of a display apparatus according to an embodiment of the present disclosure.

With reference to FIG. 9, a display panel 940 may be disposed on a substrate 941, and an encapsulation part 980 may be disposed on the display panel 940. A backplate 905 may be disposed under the substrate 941. And, a touch panel, a polarizer, and a cover window which are functional layers may be disposed on the encapsulation part 980.

For example, a touch panel 960 may be disposed on the encapsulation part 980. The touch panel 960 may be provided on the encapsulation part 980 as a touch on encapsulation (ToE) structure. The touch panel 960 may be disposed on the encapsulation part 980 using a first adhesive 930. And, a polarizer 970 may be disposed on the touch panel 960. A cover window 920 may be disposed on the polarizer 970 using a second adhesive 931. Each of the first and second adhesives 930 and 931 may be one among an OCA, an OCR, and a PSA, but is not limited thereto.

A protective film as described above with reference to FIGS. 4A to 6F may be attached on the substrate 941. The protective film decreases particles, smears, or scratches, which may contaminate a surface of the substrate 941. And, the protective film may be removed from the substrate 941, and then, the backplate 905 may be attached on a bottom of the substrate 941. The backplate 905 may be attached on the substrate 941 by an adhesive.

A protective film as described above with reference to FIGS. 4A to 6F may be attached on the touch panel 960. The protective film decreases particles, smears, or scratches, which may contaminate a surface of the touch panel 960. And, the protective film may be removed from the touch panel 960, and then, the touch panel 960 may be attached on the encapsulation part 980 by the first adhesive 930.

And, a protective film as described above with reference to FIGS. 4A to 6F may be attached on the cover window 920. The protective film decreases particles, smears, or scratches, which may contaminate a surface of the cover window 920. And, the protective film may be removed from the cover window 920, and the cover window 920 may be attached on the polarizer 970 by the second adhesive 931.

Figure 10:
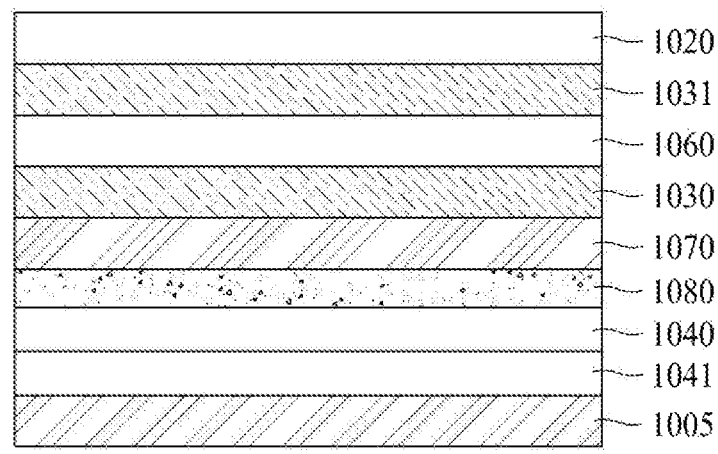
FIG. 10 is a diagram illustrating another example of a display apparatus according to an embodiment of the present disclosure.

FIG. 10 is a diagram illustrating another example of a display apparatus according to an embodiment of the present disclosure.

With reference to FIG. 10, a display panel 1040 may be disposed on a substrate 1041, and an encapsulation part 1080 may be disposed on the display panel 1040. A backplate 1005 may be disposed under the substrate 1041. And, a polarizer, a touch panel, and a cover window which are functional layers may be disposed on the encapsulation part 1080.

For example, a polarizer 1070 may be disposed on the encapsulation part 1080. And, a touch panel 1060 may be disposed on the polarizer 1070 using a first adhesive 1030. And, a cover window 1020 may be disposed on the touch panel 1060 using a second adhesive 1031. Each of the first and second adhesives 1030 and 1031 may be one among an OCA, an OCR, and a PSA, but the materials are not limited thereto.

A protective film as described above with reference to FIGS. 4A to 6F may be attached on the substrate 1041. The protective film decreases particles, smears, or scratches, which may contaminate a surface of the substrate 1041. And, the protective film may be removed from the substrate 1041, and then, the backplate 1005 may be attached on a bottom of the substrate 1041. The backplate 1005 may be attached on the substrate 1041 using an adhesive.

A protective film described above with reference to FIGS. 4A to 6F may be attached on the touch panel 1060. The protective film decreases particles, smears, or scratches, which may contaminate a surface of the touch panel 1060. And, the protective film may be removed from the touch panel 1060, and then, the touch panel 1060 may be attached on the polarizer 1070 by the first adhesive 1030.

And, a protective film described above with reference to FIGS. 4A to 6F may be attached on the cover window 1020. The protective film decreases particles, smears, or scratches, which contaminate a surface of the cover window 1020. And, the protective film may be removed from the cover window 1020, and the cover window 1020 may be attached on the touch panel 1060 using the second adhesive 1031.

And, the cover window or the touch panel described above with reference to FIGS. 7 and 8 may be identically applied to the embodiments of FIGS. 9 and 10.

A display apparatus according to an embodiment of the present disclosure comprises a display panel on a substrate, a functional layer on the substrate or the display panel, and a protective film protecting the substrate or the display panel, wherein the protective film includes a first protective film and a second protective film, the first protective film is disposed more adjacent to the display panel than the second protective film, and the first protective film includes a polymerizable compound having an adhesiveness which changes by energy.

According to one or more embodiments of the present disclosure, the adhesiveness of the first protective film may vary by ultraviolet light.

According to one or more embodiments of the present disclosure, the polymerizable compound may include a multi-functional monomer.

According to one or more embodiments of the present disclosure, an adhesiveness of the protective film after irradiating the energy may be 3.0 gf/inch to 12.5 gf/inch.

According to one or more embodiments of the present disclosure, the functional layer may include at least one among a backplate, a polarizer, a cover window, and a touch panel.

According to one or more embodiments of the present disclosure, at least one among the substrate, the backplate, the polarizer, the cover window, and the touch panel may have flexibility.

A method of manufacturing a display apparatus according to an embodiment of the present disclosure comprises attaching a lower protective film, including a first protective film including a polymerizable compound and a second protective film, on a bottom of a substrate, disposing a display panel on the substrate, attaching an upper protective film, including a third protective film including a polymerizable compound and a fourth protective film, on the display panel, irradiating energy onto the lower protective film, removing the lower protective film, and attaching a functional layer on the bottom of the substrate from which the lower protective film has been removed.

According to one or more embodiments of the present disclosure, the irradiating of the energy may include irradiating ultraviolet light onto the lower protective film for an irradiation time of 1 second or less.

According to one or more embodiments of the present disclosure, the removing of the lower protective film may include removing the lower protective film from the substrate by reducing an adhesiveness of the lower protective film using a cross-linking reaction of the polymerizable compound based on the energy.

According to one or more embodiments of the present disclosure, the adhesiveness of the lower protective film after irradiating the energy may be 3.0 gf/inch to 12.5 gf/inch.

According to one or more embodiments of the present disclosure, the attaching of the functional layer may include attaching a backplate on the bottom of the substrate.

According to one or more embodiments of the present disclosure, the method may further include, after the attaching of the functional layer on the bottom of the substrate, irradiating the energy onto the upper protective film, removing the upper protective film, and attaching another functional layer on the display panel from which the upper protective film has been removed.

According to one or more embodiments of the present disclosure, the removing of the upper protective film may include removing the upper protective film from the display panel by reducing an adhesiveness of the upper protective film by using a cross-linking reaction of the polymerizable compound based on the energy.

According to one or more embodiments of the present disclosure, the adhesiveness of the upper protective film after irradiating the energy may be 3.0 gf/inch to 12.5 gf/inch.

According to one or more embodiments of the present disclosure, the attaching of the other functional layer on the display panel may include attaching a cover window on the display panel using an adhesive.

According to one or more embodiments of the present disclosure, the attaching of the other functional layer on the display panel may include attaching a polarizer on the display panel and attaching a touch panel on the polarizer using an adhesive.

According to one or more embodiments of the present disclosure, the attaching of the other functional layer on the display panel may include attaching a touch panel on the display panel using a first adhesive, attaching a polarizer on the display panel, and attaching a cover window on the polarizer using a second adhesive.

According to one or more embodiments of the present disclosure, the attaching of the other functional layer on the display panel may include attaching a polarizer on the display panel, attaching a touch panel on the polarizer using a first adhesive, and attaching a cover window on the touch panel using a second adhesive.

According to one or more embodiments of the present disclosure, the display panel may be one of a liquid crystal panel, an organic light emitting display panel, a touch panel, a touch panel on a liquid crystal panel, and a touch panel on an organic light emitting display panel.

According to one or more embodiments of the present disclosure, the polymerizable compound may include a multi-functional monomer.

A method of manufacturing a display apparatus according to an embodiment of the present disclosure includes attaching a lower protective film, including a first protective film including a polymerizable compound and a second protective film, on a bottom of a substrate, disposing a display panel on the substrate, attaching an upper protective film, including a third protective film including a polymerizable compound and a fourth protective film, on the display panel, irradiating energy onto one of the lower protective film or the upper protective film, removing one of the lower protective film or the upper protective film, and attaching a functional layer on the bottom of the substrate, from which the lower protective film has been removed, or the display panel from which the upper protective film has been removed.

According to one or more embodiments of the present disclosure, the adhesiveness of the upper protective film or the lower protective film after irradiating the energy may be 3.0 gf/inch to 12.5 gf/inch.

According to one or more embodiments of the present disclosure, the attaching of the functional layer on the display panel may include attaching a cover window on the display panel using an adhesive.

According to one or more embodiments of the present disclosure, the attaching of the functional layer on the display panel may include attaching a polarizer on the display panel and attaching a touch panel on the polarizer using an adhesive.

According to one or more embodiments of the present disclosure, the attaching of the functional layer on the display panel may include attaching a touch panel on the display panel using a first adhesive, attaching a polarizer on the display panel, and attaching a cover window on the polarizer using a second adhesive.

According to one or more embodiments of the present disclosure, the attaching of the functional layer on the display panel may include attaching a polarizer on the display panel, attaching a touch panel on the polarizer using a first adhesive, and attaching a cover window on the touch panel using a second adhesive.

As described above, according to the embodiments of the present disclosure, the protective film including the polymerizable compound may be manufactured, the protective film for protecting the display panel or the functional layer may maintain an adhesiveness or an adhesive strength in a process of manufacturing the display apparatus, and the adhesiveness or an adhesive strength of the protective film may be reduced by irradiation energy. Accordingly, the protective film for protecting the display panel or the functional layer may be easily removed in a process of removing the protective film that protects the display panel or the functional layer.

And, according to the embodiments of the present disclosure, the protective film including the polymerizable compound may be manufactured to have an adhesiveness or an adhesive strength which is reduced by irradiation energy, and thus, damage of the layers configuring the display apparatus is prevented in a process of removing the protective film which protects the display panel or the functional layer.

And, according to the embodiments of the present disclosure, since the protective film including the polymerizable compound is manufactured to have an adhesiveness or an adhesive strength which is reduced by irradiation energy, damage of the functional layer or the layers configuring the display apparatus is prevented in a process of removing the protective film which protects the display panel or the functional layer, thereby providing display apparatuses in which a yield ratio is enhanced.

And, according to the embodiments of the present disclosure, since the protective film including the polymerizable compound is manufactured to have an adhesiveness or an adhesive strength which is reduced by irradiating energy, the adhesiveness or an adhesive strength of the protective film may be maintained in a process of manufacturing the display apparatus, and thus, the protective film is prevented from being detached or separated from the display panel or the functional layer. Also, damage of the functional layer or the layers configuring the display apparatus is prevented in a process of removing the protective film which protects the display panel or the functional layer.

And, according to the embodiments of the present disclosure, since the protective film including the polymerizable compound is manufactured, the residual of the protective film remaining in the display panel or the functional layer is prevented in a process of removing the protective film which protects the display panel or the functional layer.

According to an embodiment of the present disclosure, an apparatus comprises a substrate; a display panel on the substrate; and a protective film protecting one of the substrate and the display panel, wherein the protective film includes a first protective film and a second protective film, wherein the first protective film is disposed closer to the display panel than the second protective film, and wherein the first protective film includes a polymerizable compound having an adhesive strength that changes with energy irradiated onto the polymerizable compound.

According to one or more embodiments, the adhesive strength of the first protective film changes with ultraviolet light applied thereto.

According to one or more embodiments, the polymerizable compound includes a multi-functional monomer.

According to one or more embodiments, the first protective film is configured to have an adhesive strength of 3.0 gf/inch to 12.5 gf/inch after the energy is irradiated thereto.

According to one or more embodiments, the substrate is flexible.

According to an embodiment of the present disclosure, a method of manufacturing a display apparatus comprises disposing a display panel on a substrate; attaching a protective film, including a first protective film having a polymerizable compound and a second protective film, on one of the substrate and the display panel such that the first protective film is closer to the display panel than the second protective film; irradiating energy onto the protective film; and removing the protective film.

According to one or more embodiments, the irradiating of the energy includes irradiating ultraviolet light onto the protective film for an irradiation time of 1 second or less.

According to one or more embodiments, the removing of the protective film includes removing the protective film by reducing an adhesive strength of the protective film using a cross-linking reaction of the polymerizable compound in response to the energy irradiated onto the protective film.

According to one or more embodiments, the protective film is configured to have an adhesive strength of 3.0 gf/inch to 12.5 gf/inch after the energy is irradiated onto the protective film.

According to one or more embodiments, the method further comprises attaching an upper protective film including a third protective film having a polymerizable compound and a fourth protective film on the display panel, wherein the protective film having the first and second protective films is a lower protective film attached to a bottom of the substrate, and attaching a functional layer on the bottom of the substrate from which the lower protective film has been removed.

According to one or more embodiments, the attaching of the functional layer includes attaching a backplate to the bottom of the substrate.

According to one or more embodiments, the method further comprises irradiating energy onto the upper protective film after the attaching of the functional layer on the bottom of the substrate; removing the upper protective film; and attaching another functional layer on the display panel from which the upper protective film has been removed.

According to one or more embodiments, the attaching of the other functional layer on the display panel includes attaching a cover window on the display panel using an adhesive.

According to one or more embodiments, the attaching of the other functional layer on the display panel includes: attaching a polarizer to the display panel; and attaching a touch panel to the polarizer using an adhesive.

According to one or more embodiments, the attaching of the other functional layer on the display panel includes: attaching a touch panel to the display panel using a first adhesive; attaching a polarizer to the touch panel; and attaching a cover window to the polarizer using a second adhesive.

According to one or more embodiments, the attaching of the other functional layer on the display panel includes: attaching a polarizer to the display panel; attaching a touch panel to the polarizer using a first adhesive; and attaching a cover window to the touch panel using a second adhesive.

According to one or more embodiments, the display panel is one of a liquid crystal panel, an organic light emitting display panel, a touch panel, a touch panel on a liquid crystal panel, and a touch panel on an organic light emitting display panel.

According to one or more embodiments, the polymerizable compound includes a multi-functional monomer.

According to an embodiment of the present disclosure, a protective film for protecting a display panel comprises a first protective film; and a second protective film, wherein the first protective film includes a polymerizable compound having an adhesive strength that changes with energy irradiated onto the polymerizable compound, and wherein the protective film is configured to have an adhesive strength of 3.0 gf/inch to 12.5 gf/inch after the energy is irradiated thereto.

It will be apparent to those skilled in the art that various modifications and variations can be made in the display apparatus and method of manufacturing the same of the present disclosure without departing from the spirit or scope of the disclosures. Thus, it is intended that the present disclosure covers the modifications and variations of this disclosure provided they come within the scope of the appended claims and their equivalents.

What is claimed is:

1. An apparatus, comprising:
   a substrate;
   a display panel on the substrate; and
   a protective film protecting one of the substrate and the display panel,
   wherein the protective film includes a first protective film and a second protective film,
   wherein the first protective film is disposed closer to the display panel than the second protective film, and
   wherein the first protective film includes a polymerizable compound having an adhesive strength that changes with energy irradiated onto the polymerizable compound.

2. The apparatus of claim 1, wherein the adhesive strength of the first protective film changes with ultraviolet light applied thereto.

3. The apparatus of claim 1, wherein the polymerizable compound includes a multi-functional monomer.

4. The apparatus of claim 1, wherein the first protective film is configured to have an adhesive strength of 3.0 gf/inch to 12.5 gf/inch after the energy is irradiated thereto.

5. The apparatus of claim 1, wherein the substrate is flexible.

6. A method of manufacturing a display apparatus, the method comprising:
   disposing a display panel on a substrate;
   attaching a protective film, including a first protective film having a polymerizable compound and a second protective film, on one of the substrate and the display panel such that the first protective film is closer to the display panel than the second protective film;
   irradiating energy onto the second protective film and the first protective film; and
   removing the protective film including the first protective film and the second protective film from the display panel or the substrate.

7. The method of claim 6, wherein the irradiating of the energy includes irradiating ultraviolet light onto the protective film for an irradiation time of 1 second or less.

8. The method of claim 6, wherein the removing of the protective film includes removing the protective film by reducing an adhesive strength of the protective film using a cross-linking reaction of the polymerizable compound in response to the energy irradiated onto the protective film.

9. The method of claim 8, wherein the protective film is configured to have an adhesive strength of 3.0 gf/inch to 12.5 gf/inch after the energy is irradiated onto the protective film.

10. The method of claim 6, further comprising:
    attaching an upper protective film including a third protective film having a polymerizable compound and a fourth protective film on the display panel, wherein the protective film having the first and second protective films is a lower protective film attached to a bottom of the substrate, and attaching a functional layer on the bottom of the substrate from which the lower protective film has been removed.

11. The method of claim 10, wherein the attaching of the functional layer includes attaching a backplate to the bottom of the substrate.

12. The method of claim 10, further comprising:

after the attaching of the functional layer on the bottom of the substrate, irradiating energy onto the upper protective film;

removing the upper protective film; and attaching another functional layer on the display panel from which the upper protective film has been removed.

13. The method of claim 12, wherein the attaching of the another functional layer on the display panel includes attaching a cover window to the display panel using an adhesive.

14. The method of claim 12, wherein the attaching of the another functional layer on the display panel includes:

attaching a polarizer to the display panel; and attaching a touch panel to the polarizer using an adhesive.

15. The method of claim 12, wherein the attaching of the another functional layer on the display panel includes:

attaching a touch panel to the display panel using a first adhesive;

attaching a polarizer to the touch panel; and attaching a cover window to the polarizer using a second adhesive.

16. The method of claim 12, wherein the attaching of the another functional layer on the display panel includes:

attaching a polarizer to the display panel;

attaching a touch panel to the polarizer using a first adhesive; and attaching a cover window to the touch panel using a second adhesive.

17. The method of claim 6, wherein the display panel is one of a liquid crystal panel, an organic light emitting display panel, a touch panel, a touch panel on a liquid crystal panel, and a touch panel on an organic light emitting display panel.

18. The method of claim 6, wherein the polymerizable compound includes a multi-functional monomer.

* * * * *